United States Patent
Streefkerk et al.

(10) Patent No.: US 8,587,762 B2
(45) Date of Patent: Nov. 19, 2013

(54) METHODS RELATING TO IMMERSION LITHOGRAPHY AND AN IMMERSION LITHOGRAPHIC APPARATUS

(75) Inventors: Bob Streefkerk, Tilburg (NL); Roelof Frederik De Graaf, Veldhoven (NL); Johannes Catharinus Hubertus Mulkens, Waalre (NL); Marcel Beckers, Eindhoven (NL); Paul Petrus Joannes Berkvens, Veldhoven (NL); David Lucien Anstotz, Westhoffen (FR)

(73) Assignee: ASML Netherlands B.V., Veldhoven (NL)

( * ) Notice: Subject to any disclaimer, the term of this patent is extended or adjusted under 35 U.S.C. 154(b) by 654 days.

(21) Appl. No.: 12/237,557

(22) Filed: Sep. 25, 2008

(65) Prior Publication Data
US 2009/0086175 A1    Apr. 2, 2009

Related U.S. Application Data

(60) Provisional application No. 60/960,386, filed on Sep. 27, 2007, provisional application No. 61/071,335, filed on Apr. 22, 2008.

(51) Int. Cl.
*G03B 27/52* (2006.01)
*G03B 27/42* (2006.01)

(52) U.S. Cl.
USPC .............................................. 355/30; 355/53

(58) Field of Classification Search
USPC ..................... 355/30, 53, 67; 250/548
See application file for complete search history.

(56) References Cited

U.S. PATENT DOCUMENTS

| | | | |
|---|---|---|---|
| 4,509,852 A | 4/1985 | Tabarelli et al. | |
| 5,610,683 A * | 3/1997 | Takahashi | 355/53 |
| 6,496,257 B1 | 12/2002 | Taniguchi et al. | 356/239.2 |
| 7,050,146 B2 | 5/2006 | Duineveld et al. | 355/30 |
| 7,091,502 B2 | 8/2006 | Gau et al. | 250/492.2 |
| 7,224,427 B2 | 5/2007 | Chang et al. | 355/30 |
| 7,224,434 B2 | 5/2007 | Tokita | 355/53 |
| 7,251,017 B2 | 7/2007 | Novak et al. | |
| 7,307,263 B2 | 12/2007 | Bakker et al. | 250/492.2 |
| 7,315,033 B1 | 1/2008 | Pawloski et al. | 250/492.2 |
| 7,345,742 B2 | 3/2008 | Novak et al. | |
| 7,385,670 B2 | 6/2008 | Compen et al. | 355/30 |

(Continued)

FOREIGN PATENT DOCUMENTS

| | | |
|---|---|---|
| CN | 1830064 | 9/2006 |
| CN | 1963673 | 5/2007 |

(Continued)

OTHER PUBLICATIONS

Partial European Search Report issued on Jan. 30, 2009 in European Application No. 08253055.1.

(Continued)

*Primary Examiner* — Hung Henry Nguyen
(74) *Attorney, Agent, or Firm* — Pillsbury Winthrop Shaw Pittman LLP

(57) ABSTRACT

A method of operating a fluid confinement system of an immersion lithographic apparatus is disclosed. The performance of the liquid confinement system is measured in several different ways. On the basis of the result of the measurement of performance, a signal indicating, for example, that a remedial action may need to be taken is generated.

29 Claims, 7 Drawing Sheets

(56) References Cited

U.S. PATENT DOCUMENTS

| | | | |
|---|---|---|---|
| 7,405,417 B2 | 7/2008 | Stevens et al. | 250/504 R |
| 7,456,929 B2 * | 11/2008 | Shibuta | 355/53 |
| 7,462,850 B2 | 12/2008 | Banine et al. | 250/504 R |
| 7,463,330 B2 * | 12/2008 | Streefkerk et al. | 355/30 |
| 7,505,115 B2 * | 3/2009 | Magome et al. | 355/53 |
| 7,779,781 B2 | 8/2010 | Mertens et al. | |
| 2004/0136494 A1 | 7/2004 | Lof et al. | |
| 2004/0207824 A1 | 10/2004 | Lof et al. | |
| 2005/0024609 A1 | 2/2005 | De Smit et al. | 355/18 |
| 2005/0048220 A1 | 3/2005 | Mertens et al. | |
| 2005/0078286 A1 | 4/2005 | Dierichs et al. | |
| 2005/0175776 A1 | 8/2005 | Streefkerk et al. | 427/256 |
| 2005/0264774 A1 | 12/2005 | Mizutani et al. | 355/30 |
| 2005/0274898 A1 | 12/2005 | Watanabe et al. | 250/372 |
| 2006/0007419 A1 | 1/2006 | Streefkerk et al. | |
| 2006/0023185 A1 | 2/2006 | Hazelton et al. | 355/53 |
| 2006/0038968 A1 | 2/2006 | Kemper et al. | |
| 2006/0050351 A1 | 3/2006 | Higashiki | 359/228 |
| 2006/0103818 A1 | 5/2006 | Holmes et al. | 355/53 |
| 2006/0132731 A1 | 6/2006 | Jansen et al. | 355/30 |
| 2006/0132737 A1 | 6/2006 | Magome et al. | |
| 2006/0158627 A1 | 7/2006 | Kemper et al. | |
| 2006/0232757 A1 | 10/2006 | Tani et al. | 355/53 |
| 2006/0250588 A1 | 11/2006 | Brandl | 355/30 |
| 2006/0256316 A1 | 11/2006 | Tanno et al. | 355/72 |
| 2007/0002296 A1 | 1/2007 | Chang et al. | 355/53 |
| 2007/0026345 A1 | 2/2007 | Subramanian et al. | 430/311 |
| 2007/0064215 A1 | 3/2007 | Dirksen et al. | 355/77 |
| 2007/0076197 A1 | 4/2007 | Koga | 356/237.3 |
| 2007/0085989 A1 | 4/2007 | Nagahashi et al. | 355/53 |
| 2007/0091287 A1 | 4/2007 | Chang et al. | 355/30 |
| 2007/0127001 A1 | 6/2007 | Van Der Hoeven | 355/53 |
| 2007/0146657 A1 | 6/2007 | Van Mierlo et al. | 355/30 |
| 2007/0146658 A1 | 6/2007 | Van Mierlo et al. | 355/30 |
| 2007/0146663 A1 | 6/2007 | Nagasaka | |
| 2007/0159610 A1 | 7/2007 | Shiraishi | 355/53 |
| 2007/0172234 A1 | 7/2007 | Shigemori et al. | 396/611 |
| 2007/0206279 A1 | 9/2007 | Brueck et al. | 359/391 |
| 2007/0229789 A1 | 10/2007 | Kawamura | 355/53 |
| 2007/0247600 A1 | 10/2007 | Kobayashi et al. | 355/30 |
| 2007/0251543 A1 | 11/2007 | Singh | 134/1 |
| 2007/0253710 A1 | 11/2007 | Kaneyama et al. | 396/611 |
| 2007/0258072 A1 | 11/2007 | Nagasaka et al. | 355/53 |
| 2007/0268469 A1 | 11/2007 | Fu et al. | |
| 2007/0274711 A1 | 11/2007 | Kaneyama et al. | 396/611 |
| 2007/0285631 A1 | 12/2007 | Stavenga et al. | 355/30 |
| 2008/0002162 A1 | 1/2008 | Jansen et al. | 355/30 |
| 2008/0049201 A1 | 2/2008 | Stavenga et al. | 355/30 |
| 2008/0212051 A1 * | 9/2008 | Beckers et al. | 355/30 |
| 2008/0218712 A1 | 9/2008 | Compen et al. | 355/30 |
| 2008/0273181 A1 | 11/2008 | De Jong et al. | 355/30 |
| 2008/0284990 A1 | 11/2008 | De Jong et al. | 355/30 |
| 2009/0025753 A1 | 1/2009 | De Jong et al. | 134/10 |
| 2009/0027635 A1 | 1/2009 | De Jong et al. | 355/30 |
| 2009/0027636 A1 | 1/2009 | Leenders et al. | 355/30 |

FOREIGN PATENT DOCUMENTS

| | | |
|---|---|---|
| EP | 1420298 A2 | 5/2004 |
| EP | 1420300 A2 | 5/2004 |
| EP | 1477856 A1 | 11/2004 |
| EP | 1 524 558 | 4/2005 |
| EP | 1628163 A2 | 2/2006 |
| EP | 1653501 A1 | 3/2006 |
| EP | 1 739 489 A2 | 1/2007 |
| EP | 1 821 338 | 8/2007 |
| EP | 1821337 A1 | 8/2007 |
| JP | 2000-323396 | 11/2000 |
| JP | 2005-072404 | 3/2005 |
| JP | 2005-079222 | 3/2005 |
| JP | 2005-223315 | 8/2005 |
| JP | 2005-268742 | 9/2005 |
| JP | 2006-134999 | 5/2006 |
| JP | 2006-179761 | 7/2006 |
| JP | 2006-523028 T | 10/2006 |
| JP | 2006-310706 | 11/2006 |
| JP | 2007-029973 | 2/2007 |
| JP | 2007-088040 A | 4/2007 |
| JP | 2007-088328 | 4/2007 |
| JP | 2007-142217 | 6/2007 |
| JP | 2007-150102 | 6/2007 |
| JP | 2007-227543 | 9/2007 |
| JP | 2007-227580 | 9/2007 |
| JP | 2008041822 * | 2/2008 |
| WO | 9949504 A1 | 9/1999 |
| WO | WO 2005/122218 | 12/2005 |
| WO | WO 2006/041086 | 4/2006 |
| WO | WO 2006/062065 | 6/2006 |
| WO | WO 2006/122578 | 11/2006 |
| WO | WO 2007/006447 | 1/2007 |
| WO | WO 2007/135990 | 11/2007 |
| WO | WO 2007/136089 | 11/2007 |
| WO | WO 2008/001871 | 1/2008 |

OTHER PUBLICATIONS

Japanese Office Action mailed Feb. 10, 2011 in corresponding Japanese Patent Application No. 2008-239006.
European Search Report for Application No. 08253055.1 dated May 28, 2009.
Korean Office Action for Application No. 10-2008-0094779 dated Jun. 11, 2010.
Chinese Office Action dated Jul. 9, 2012 in corresponding Chinese Patent Application No. 200810168934.0.
Taiwan Office Action dated Oct. 29, 2012 in corresponding Taiwan Patent Application No. 097136168.
European Office Action dated Jan. 17, 2013 in corresponding European Patent Application No. 08 253 055.1.
Duineveld et al., U.S. Appl. No. 12/153,717, May 22, 2008.
Kadijk et al., U.S. Appl. No. 12/233,000, Sep. 26, 2008.
De Jong et al., U.S. Appl. No. 12/289,621, Oct. 30, 2008.
De Jong et al., U.S. Appl. No. 12/314,611, Dec. 12, 2008.
De Graaf et al., U.S. Appl. No. 12/318,037, Dec. 19, 2008.
De Jong, U.S. Appl. No. 12/358,000, Jan. 22, 2009.

* cited by examiner

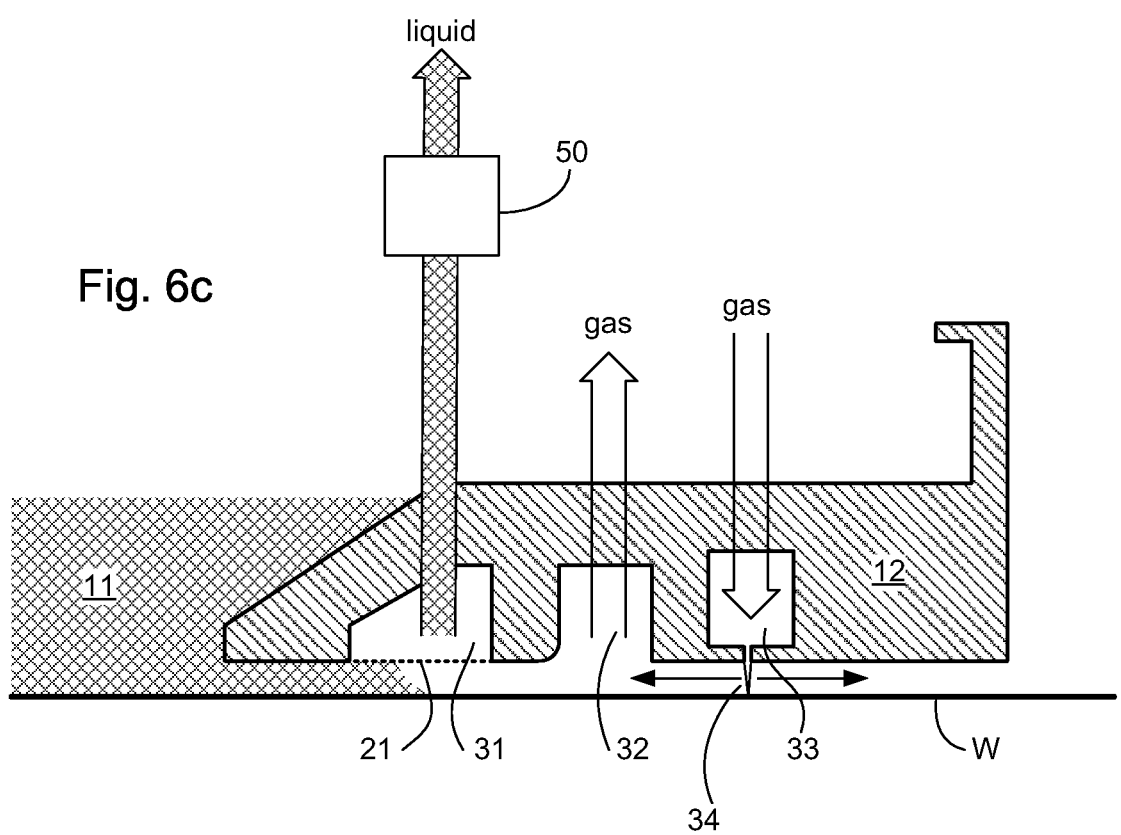

METHODS RELATING TO IMMERSION LITHOGRAPHY AND AN IMMERSION LITHOGRAPHIC APPARATUS

This non-provisional application claims the benefit of and priority under 35 U.S.C. §119(e) to U.S. Provisional Application No. 60/960,386 filed Sep. 27, 2007, and to U.S. Provisional Application No. 61/071,335 filed Apr. 22, 2008, the entire contents of each of the foregoing applications is hereby incorporated by reference.

FIELD

The present invention relates to a method of operating a fluid confinement system and an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein. One or more embodiments are described herein in relation to the immersion liquid being water. However, one or more embodiments are equally applicable to other types of immersion liquid and other fluid. Such immersion fluids may have a refractive index greater than that of air. Desirably, the immersion fluid has a refractive index greater than that of water.

However, submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, desirably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Many types of immersion lithography apparatus have in common that immersion fluid is provided to a space between the final element of the projection system and the substrate. That liquid is also usually removed from that space. For example, such removal may be for cleaning of the immersion fluid or for temperature conditioning of the immersion fluid, etc.

SUMMARY

It is desirable, for example, to maintain performance of an immersion lithographic apparatus over time. It is desirable, for example, to provide a method of detecting contamination of a fluid confinement system and/or a method of determining when a fluid confinement system of an immersion lithographic apparatus needs cleaning.

According to an aspect of the invention, there is provided a method of operating a fluid handling system of an immersion lithographic apparatus. The method includes measuring a performance parameter of the fluid handling system indicative of a level of containment of fluid between the fluid handling system and a substrate and/or substrate table; and generating a signal if the measuring indicates a loss in performance below a certain threshold which signal brings to attention that the containment performance of the fluid handling system has dropped below the certain threshold.

According to an aspect of the invention, there is provided a method of detecting contamination of a fluid handling system of an immersion lithographic apparatus. The method includes (i) detecting a change in heat loss from a component during operation of the fluid handling system or (ii) detecting a pressure variation on an outlet side of a single phase extractor of the fluid handling system or (iii) counting contaminant particles in a fluid flow associated with the fluid handling system or (iv) detecting a pressure variation and/or flow rate variation in fluid passing through an outlet and/or an inlet of the fluid handling system or (v) detecting liquid leaking past a confinement component of the fluid handling system or (vi) detecting a change in force applied to the fluid handling system in order to maintain its desired position or (vii) any combination selected from (i)-(vi).

According to an aspect of the invention, there is provided a method of detecting contamination of a fluid handling system of a lithographic apparatus. The method includes contacting a porous member of the fluid handling system with fluid on a first side; removing fluid at a constant rate from a second side of the porous member which second side is opposite the first side; and detecting contamination by monitoring pressure of the fluid removed at the constant rate.

According to an aspect of the invention, there is provided a method of detecting contamination of a fluid handling system of an immersion lithographic apparatus. The method includes extracting fluid from a space between a projection system and a substrate and/or substrate table; counting the number of contaminant particles present in the extracted fluid; and determining when the number of contaminant particles exceeds a certain threshold.

According to an aspect of the invention, there is provided an immersion lithographic apparatus that includes a fluid handling system and a controller configured to measure a performance parameter of the fluid handling system and to bring to attention that the performance of the fluid handling system has dropped below a certain threshold if the measurement indicates a loss in performance below a certain threshold.

According to an aspect of the invention, there is provided a method of operating a fluid handling system of an immersion lithographic apparatus. The method includes detecting a pressure variation on an outlet side of a single phase extractor of the fluid handling system; and generating a signal if the detecting indicates a level of containment of fluid between the fluid handling system and a substrate and/or substrate table has dropped below a certain threshold.

According to an aspect of the invention, there is provided a method of operating a fluid handling system of an immersion lithographic apparatus. The method includes counting contaminant particles in a fluid flow associated with the fluid handling system; and generating a signal if a number of particles exceeds a certain threshold, the certain threshold being indicative of a reduction in a level of containment of fluid between the fluid handling system and a substrate and/or substrate table.

According to an aspect of the invention, there is provided a method of operating a fluid handling system of an immersion lithographic apparatus. The method includes detecting a variation in heat loss of the fluid handling system, and generating a signal if the detecting indicates a level of containment of fluid between the fluid handling system and a substrate and/or substrate table has dropped below a certain threshold.

According to an aspect of the invention, there is provided a method of operating a fluid handling system of an immersion lithographic apparatus. The method includes detecting a pressure variation and/or a flow rate variation in fluid passing through an outlet and/or an inlet of the fluid handling system, and generating a signal if the detecting indicates a level of containment of fluid between the fluid handling system and a substrate and/or substrate table has dropped below a certain threshold.

According to an aspect of the invention, there is provided a method of operating a fluid handling system of an immersion lithographic apparatus. The method includes detecting liquid leaking past a confinement component of the fluid handling system, and generating a signal if the detecting indicates a level of containment of fluid between the fluid handling system and a substrate and/or substrate table has dropped below a certain threshold.

According to an aspect of the invention, there is provided a method of operating a fluid handling system of an immersion lithographic apparatus. The method includes detecting a change in force applied to the fluid handling system in order to maintain its desired position, and generating a signal if the detecting indicates a level of containment of fluid between the fluid handling system and a substrate and/or substrate table has dropped below a certain threshold.

A certain threshold is a parameter selected based on experience, empirical data or theory. The threshold may be selected or chosen by user choice. The threshold may be determined by selected conditions and/or parameters of operation. The threshold may be determined by in-line measurements of other specified parameters. The threshold may be selected prior to operation.

According to an aspect of the invention, there is provided a method of detecting residual liquid from a fluid handling system of a lithographic apparatus, the method comprising: determining a first height profile of a surface; applying a liquid to the surface using the fluid handling system; moving the surface relative to the fluid handling system, residual liquid remaining on the surface after the moving; determining a second height profile of the surface and the residual liquid remaining on the surface; and determining the presence of the residual liquid by comparing the first and second height profiles.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 6a-c depict a further liquid supply system;

DETAILED DESCRIPTION

Figure 1:
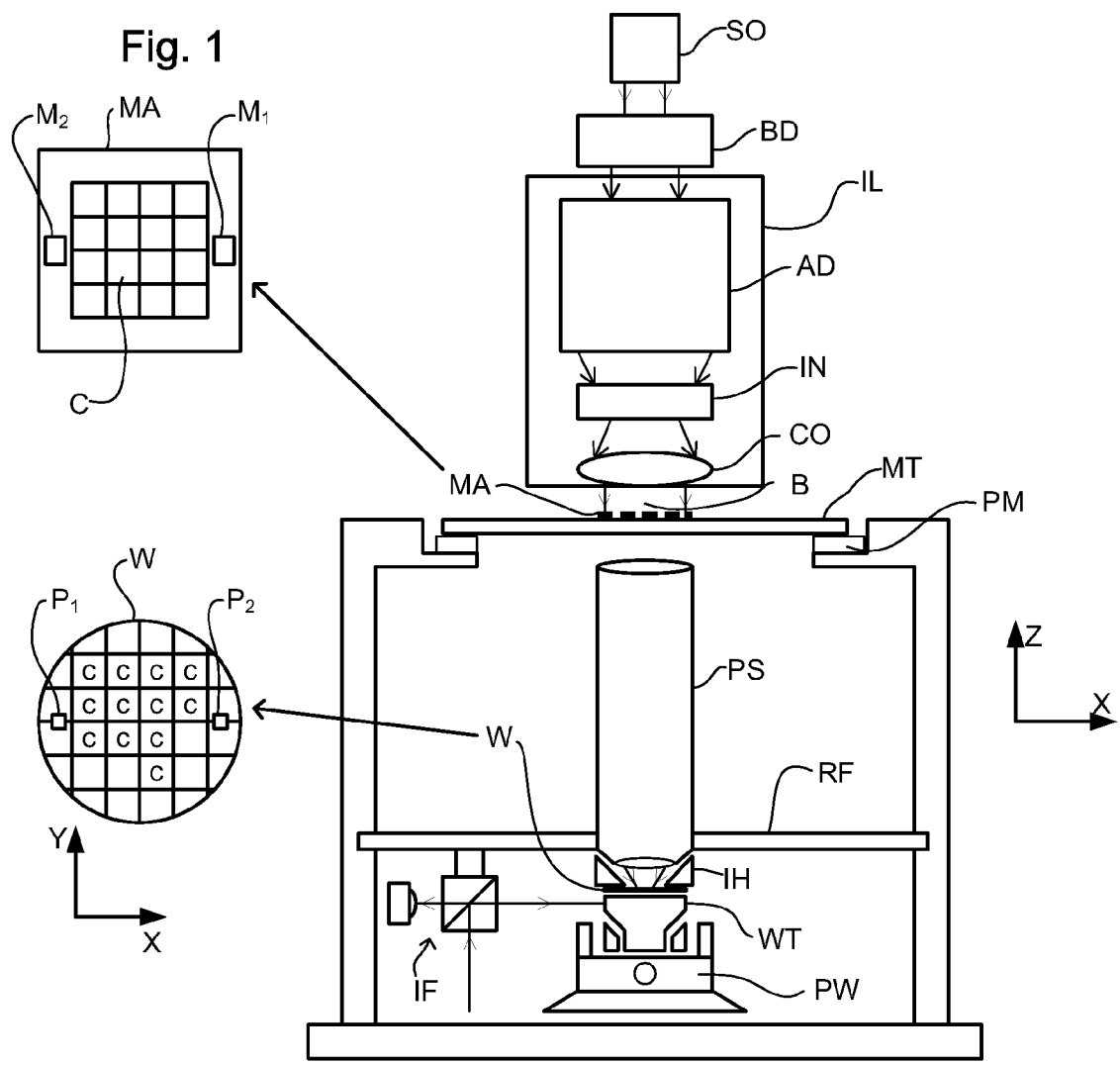
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support structure MT and the substrate table WT are scanned synchronously while a pattern imparted to the radiation beam is projected onto a target portion C (i.e. a single dynamic exposure). The velocity and direction of the substrate table WT relative to the patterning device support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
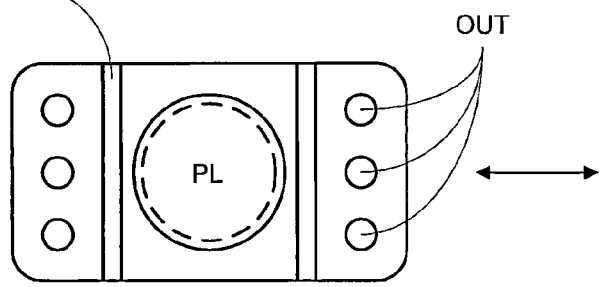
FIG. 4 depicts a further liquid supply system for use in a lithographic projection apparatus.
Figure 4:
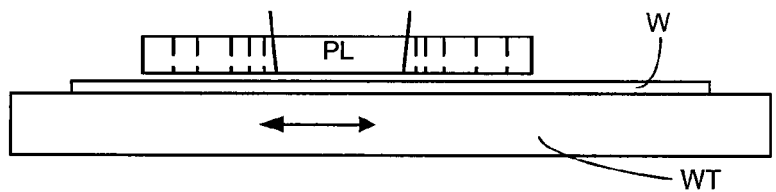

An immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and outlets OUT can be arranged in a plate with a hole in its center and through which radiation is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
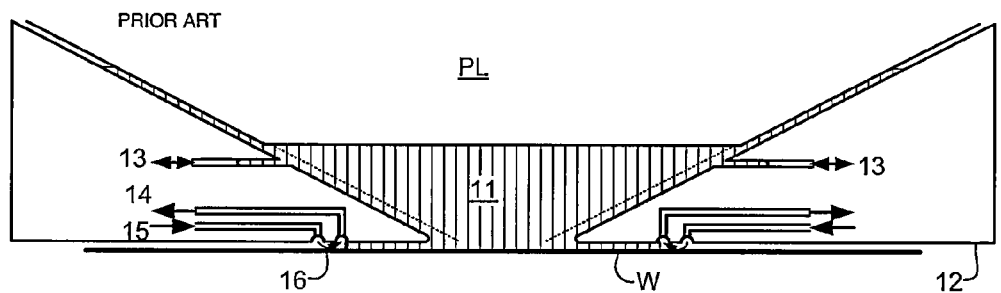
FIG. 5 depicts a liquid supply system.

Another immersion lithography solution with a localized liquid supply system solution which has been proposed is to provide the liquid supply system with a liquid confinement structure (sometimes referred to as an immersion hood) which extends along at least a part of a boundary of the space between the final element of the projection system and the substrate table. The liquid confinement structure is substantially stationary relative to the projection system in the XY plane though there may be some relative movement in the Z direction (in the direction of the optical axis). In an embodiment, a seal is formed between the liquid confinement structure and the surface of the substrate. Desirably, the seal is a contactless seal such as a gas seal. Such a system with a gas seal is illustrated in FIG. 5 and is disclosed in United States patent application publication no. US 2004-0207824, hereby incorporated in its entirety by reference.

Referring to FIG. 5, reservoir 11 forms a contactless seal to the substrate around the image field of the projection system so that liquid is confined to fill an immersion space between the substrate surface and the final element of the projection system. The reservoir is at least partly formed by a liquid confinement structure 12 positioned below and surrounding the final element of the projection system PL. Liquid is brought into the space below the projection system and within the liquid confinement structure 12 through port 13 (and optionally removed by port 13). The liquid confinement structure 12 extends a little above the final element of the projection system and the liquid rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid.

The substrate W may be removed from the substrate table WT, for example, between exposures of different substrates. When this occurs it may be desirable for liquid to be kept within the liquid confinement structure 12. This may be achieved by moving the liquid confinement structure 12 relative to the substrate table WT, or vice versa, so that the liquid confinement structure is over a surface of the substrate table WT away from the substrate W. Such a surface is a shutter member. Immersion liquid may be retained in the liquid confinement structure by operating the gas seal 16 or by clamping the surface of the shutter member to the undersurface of the liquid confinement structure 12. The clamping may be achieved by controlling the flow and/or pressure of fluid provided to the undersurface of the liquid confinement system 12. For example, the pressure of gas supplied from the inlet 15 and/or the under pressure exerted from the first outlet 14 may be controlled.

The shutter member may be an integral part of the substrate table WT or it may be a detachable and/or replaceable component of the substrate table WT. Such a detachable component may be referred to as closing disk or a dummy substrate. In a dual or multi-stage arrangement, the entire substrate table WT is replaced during substrate exchange. In such an arrangement the detachable component may be transferred between substrate tables. The shutter member may be an intermediate table that may be moved adjacent to the substrate table WT, for example, prior to exchange of the substrate under the liquid confinement structure 12. The liquid confinement structure 12 may then be moved over the intermediate table, or vice versa. The shutter member may be a moveable component of the substrate table, such as a retractable bridge, which may be positioned between substrate tables, for example, during substrate exchange. The surface of the shutter member may be moved under the liquid confinement structure, or vice versa.

Figure 6A:
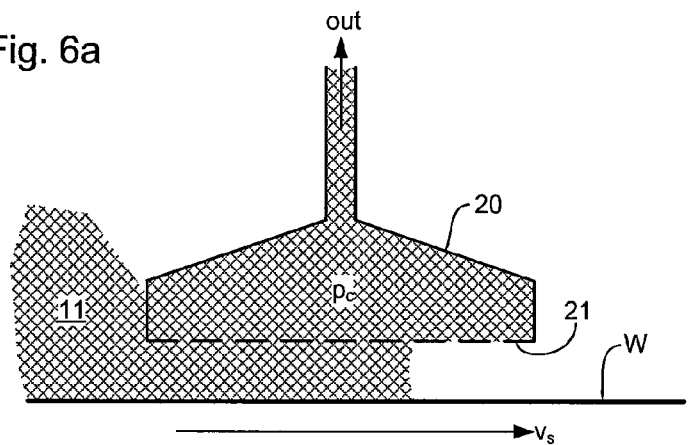
Figure 6B:
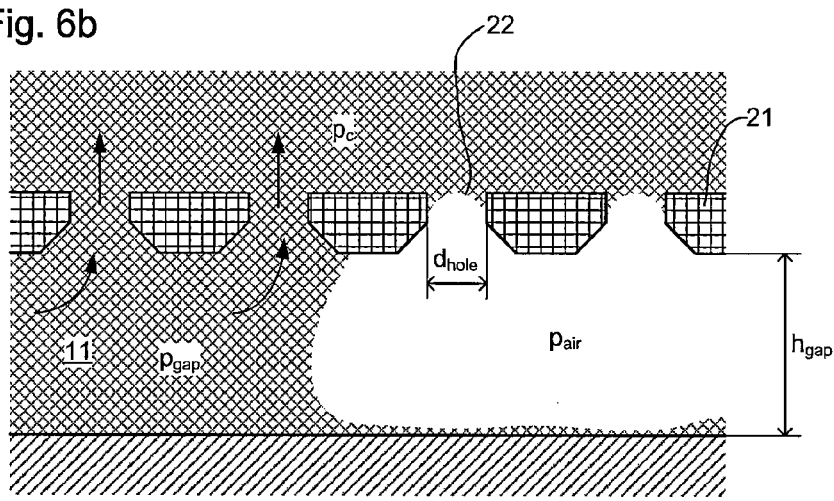

FIGS. 6a and 6b, the latter of which is an enlarged view of part of the former, illustrate a liquid removal device 20 which may be used in an immersion system to remove liquid between the liquid confinement structure IH and the substrate W. The liquid removal device 20 comprises a chamber which is maintained at a slight underpressure $p_c$ and is filled with the immersion liquid. The lower surface of the chamber is formed of a porous member 21 having a plurality of small holes, e.g. of diameter $d_{hole}$ in the range of about 5 μm to about 50 μm, and is maintained at a height $h_{gap}$ in the range of about 50 μm to about 300 μm above a surface from which liquid is to be removed, e.g. the surface of a substrate W. The porous member 21 may be a perforated plate or any other suitable structure that is configured to allow the liquid to pass therethrough. In an embodiment, porous member 21 is at least slightly liquidphilic, i.e. having a contact angle of greater than 0°, but less than 90° to the immersion liquid, e.g. water (in which case it would be hydrophilic).

The underpressure $p_c$ is such that the menisci 22 formed in the holes in the porous member 21 prevent gas being drawn into the chamber of the liquid removal device. However, when the porous member 21 comes into contact with liquid on the surface W there is no meniscus to restrict flow and the liquid can flow freely into the chamber of the liquid removal device. Such a device can remove most of the liquid from the surface of a substrate W, though a thin film of liquid may remain, as shown in the drawings.

To improve or maximize liquid removal, the porous member 21 should be as thin as possible and the pressure differential between the pressure in the liquid $p_{gap}$ and the pressure in the chamber $p_c$ should be as high as possible, while the pressure differential between $p_c$ and the pressure in the gas in the gap $p_{air}$ should be low enough to prevent a significant amount of gas being drawn into the liquid removal device 20. It may not always be possible to prevent gas being drawn into the liquid removal device but the porous member may prevent large uneven flow that may cause vibration. A micro-sieve made by electroforming, photo etching and/or laser cutting can be used as the porous member 21. A suitable sieves is made by Stork Veco B. V., of Eerbeek, the Netherlands. Other porous plates or solid blocks of porous material may also be used, provided the pore or hole size is suitable to maintain a meniscus with the pressure differential that will be experienced in use.

Such liquid removal devices can be incorporated into many types of liquid supply system 12, IH. One example is illustrated in FIG. 6c as disclosed in United States Patent Application Publication No. US 2006-0038968. FIG. 6c is a cross-sectional view of one side of the liquid confinement structure 12, which forms a ring (as used herein, a ring may be circular, rectangular or any other shape) at least partially around the exposure field of the projection system PL (not shown in FIG. 6c). In this embodiment, the liquid removal device 20 is formed by a ring-shaped chamber 31 near the innermost edge of the underside of the liquid confinement structure 12. The lower surface of the chamber 31 is formed by a porous member such as the porous member 21 described above. Ring-shaped chamber 31 is connected to a suitable pump or pumps to remove liquid from the chamber and maintain the desired underpressure. In use, the chamber 31 is full of liquid but is shown empty here for clarity.

Outward of the ring-shaped chamber 31 are a gas extraction ring 32 and a gas supply ring 33. The gas supply ring 33 has a narrow slit in its lower part and is supplied with gas, e.g. air, artificial air or flushing gas, at a pressure such that the gas escaping out of the slit forms a gas knife 34. The gas forming the gas knife is extracted by a suitable vacuum pump connected to the gas extraction ring 32 so that the resulting gas flow drives any residual liquid inwardly where it can be removed by the liquid removal device and/or a vacuum pump, which should be able to tolerate vapor of the immersion liquid and/or small liquid droplets. However, since the majority of the liquid is removed by the liquid removal device 20, the small amount of liquid removed via the vacuum system should not cause an unstable flow which may lead to vibration.

Figure 2:
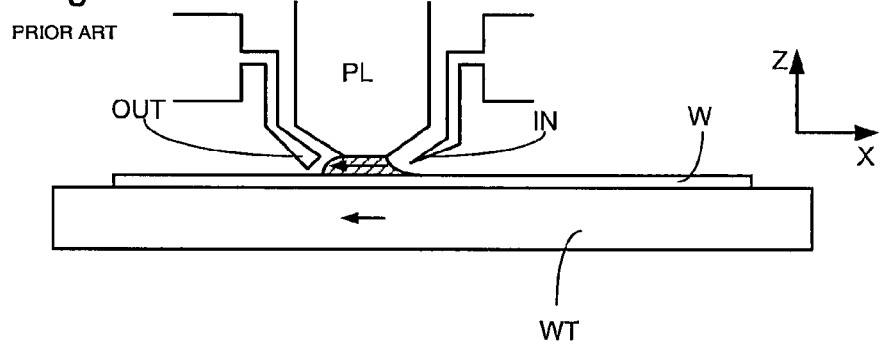
FIGS. 2 and 3 depict a liquid supply system for use in a lithographic projection apparatus.
Figure 3:
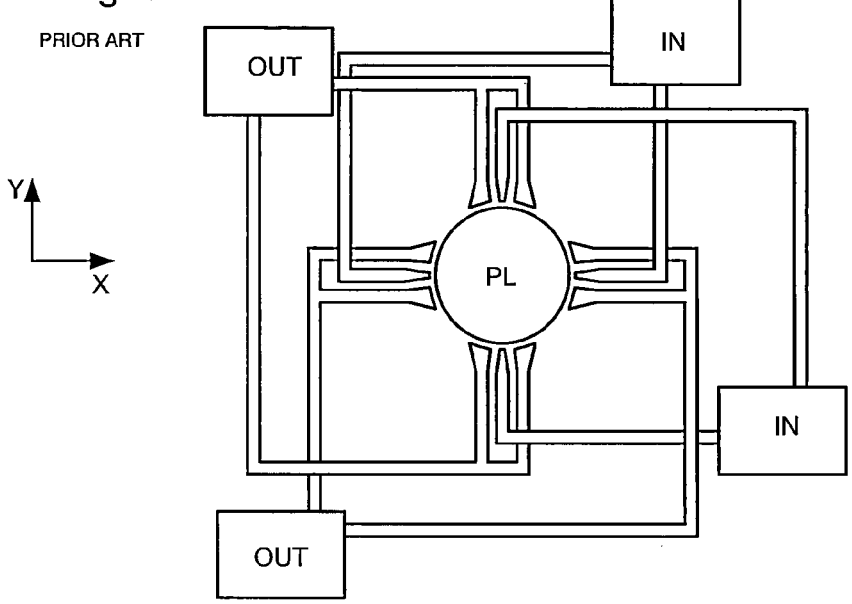

While the chamber 31, gas extraction ring 32, gas supply ring 33 and other rings are described as rings herein, it is not necessary that they surround the exposure field or be complete. In an embodiment, such inlet(s) and outlet(s) may simply be circular, rectangular or other type of elements extending partially along one or more sides of the exposure field, such as for example, shown in FIGS. 2, 3 and 4. They may be continuous or discontinuous.

In the apparatus shown in FIG. 6c, most of the gas that forms the gas knife is extracted via gas extraction ring 32, but some gas may flow into the environment around the liquid confinement structure and potentially disturb the interferometric position measuring system IF. This may be prevented by the provision of an additional gas extraction ring outside the gas knife (not illustrated).

Further examples of how such a single phase extractor can be used in a liquid supply system can be found, for example in European Patent Application Publication No. 1,628,163 and United States Patent Application Publication No. US 2006-0158627. In most applications the porous member will be on an underside of the liquid supply system and the maximum speed at which the substrate W can move under the projection system PS is at least in part determined by the efficiency of removal of liquid through the porous member 21.

A single phase extractor can also be used in two phase mode in which both liquid and gas are extracted (say 50% gas, 50% liquid). The term single phase extractor is not intended herein to be interpreted only as an extractor which extracts one phase, but more generally as an extractor which incorporates a porous member through which gas and/or liquid is/are extracted.

The above mentioned single phase extractor (as well as other types) can be used in a liquid supply system which supplies liquid to only a localized area of the top surface of the substrate. Furthermore, such a single phase extractor can also be used in other types of immersion apparatus. For example, single phase extractors can be used in a bath type immersion lithographic apparatus. In the bath type immersion lithographic apparatus the whole of the top surface of the substrate is covered in liquid. The extractors may be used for an immersion fluid other than water. The extractors may be used in a so-called "leaky seal" liquid supply system. In such a liquid supply system, liquid is provided to the space between the final element of the projection system and the substrate. That liquid is allowed to leak from that space radially outwardly. For example, a liquid supply system is used which does not form a seal between itself and the top surface of the substrate or substrate table, as the case may be. The immersion fluid may only be retrieved radially outwardly of the substrate in a "leaky seal" apparatus.

A difficulty with the above mentioned single phase extractor is that holes 22 in the porous member 21 may become blocked by debris. The debris may include resist and/or top coat. Such debris may be lifted off from the substrate during imaging. Blocking of the holes 22 can affect a performance parameter of the liquid supply/removal system. That is, the level of the containment of fluid between the fluid handling system and a substrate (e.g. how much liquid is escaping in an undesirable or unwanted manner) by the fluid handling system may be indicated by the performance parameter. Blocking of the holes 22 may reduce the maximum speed at which the substrate can be moved without leaking of the liquid from the liquid supply system. That is, the efficiency of the single phase extractor is decreased. One way of looking at this is that as the porous member 21 gets contaminated with resist or top coat, the contact angle of the liquid to the porous member 21 increases. An increase in contact angle means that the porous member 21 is less hydrophilic. A less hydrophilic porous member 21 leads to liquid loss at lower scan speeds than for an uncontaminated porous member 21.

One or more other components of a liquid supply/liquid removal system may also lose performance when contaminated. It is therefore desirable to detect such contamination and provide a signal indicative that remedial action should be taken, if desired. For example, it may be desirable to clean the liquid supply/removal system if the measuring indicates a loss in performance below a certain (e.g., predetermined) threshold. Alternatively or additionally, it may be desirable to replace one or more parts of the liquid supply/removal system, such as the porous member 21. Other methods of mitigation may be alternatively or additionally used, such as changing one or more operating conditions (e.g. increase under pressure to the porous member 21 or reduce scanning speed), and the examples provided should not be considered to be limiting in any way. It may also be desirable to take no action. A controller may be provided to carry out the measuring either in line or off line. One way of measuring for contamination is to indirectly measure a performance parameter of the liquid supply/removal system (for example the contact angle of liquid to the porous member 21, or contamination of the porous member 21). The controller may comprise a processor. The processor may run one or more computer programs and/or threshold values and/or measured data may be stored on a memory associated with the controller.

Although embodiments are described below, there may be other ways of measuring the performance of the fluid confinement system. Desirably, the measuring of the performance of the liquid supply/removal system is an indirect measuring of the contact angle of liquid to a component of the liquid supply/removal system. A reduction in contact angle can be detected by measuring a performance parameter. For example, a variation in heat load on a component of the immersion system can indicate a change in performance and therefore contact angle. A variation in heat load may be due to a change in evaporation rate. Alternatively or additionally, detecting a pressure variation either upstream or downstream of one or more liquid/fluid inlets or outlets can indicate a change in performance and therefore contact angle. Pressure measurement in other extractor components (e.g., an outlet positioned radially outwardly of the single phase extractor) may be used to measure performance. Another possibility is to measure the force applied to the fluid confinement system by an actuator to keep it in place. Also, the leaking of fluid may be measured directly. That can be done in-line (e.g., by using a capacitance or magnetic sensor) or off-line (e.g., by testing an imaged substrate for defects). Also, a loss in efficiency of an optical sensor used to measure the position of the substrate table (e.g., an optical sensor used to measure the height of the transmission image sensor plate). Further, contamination may be measured either directly (for example, by counting contaminant particles) or indirectly (for example, by monitoring a pressure variation of an underpressure applied to a filter).

Once the measuring indicates a loss in performance, for example a reduction in contact angle, below a certain threshold, an indication that the threshold has been reached may be provided. The indication may be in the form of a signal to a controller and/or a visual signal and/or and audible signal to an operator of the apparatus, or any combination thereof. That is, the signal brings to attention that performance of the fluid handling system has dropped below a certain threshold. This may allow one or more of the remedial actions described above to take place. The cleaning may involve cleaning the apparatus as a whole or only part of the apparatus. For example the cleaning may only involve the cleaning of a single phase extractor, for example.

FIG. 6c illustrates an embodiment of a liquid confinement system. However, it will be understood that one or more embodiments of the invention can be applied to other types of liquid extractors than the single phase extractor of FIGS. 6a and 6b. An embodiment can also be applied to a liquid inlet. Furthermore, the embodiment may be applied to different types of liquid supply systems and different types of liquid removal systems.

In the liquid confinement system of FIG. 6c, liquid is extracted through the single phase extractor. When the porous member 21 becomes contaminated, the contact angle the fluid has to the porous member 21 decreases. Thus the maximum speed at which the substrate W may move below the liquid confinement structure 12 without leaking of liquid beyond porous member 21 decreases. This is undesirable as it can lead to a reduction in throughput and/or liquid coming into contact with parts of the apparatus or substrate W undesirably.

In order to help avoid that situation, a particle counter 50 may be provided. The particle counter 50 is provided downstream of the single phase extractor. Thus the number of particles passing through the single phase extractor can be counted. After a certain number of particles have been counted, the controller generates an indication or signal as described above.

The threshold number of particles is chosen based on experience, empirical data or theory. Some of the larger particles will adhere to the porous member 21 so that only smaller particles will be counted by the particle counter 50. However there may be a correlation between the number of particles trapped in the porous member (and thereby reducing performance) and the number of particles passing through the counter and being counted by the counter.

The counter 50 may additionally or alternatively be placed elsewhere in the system. For example, the counter 50 may be placed upstream or downstream of a liquid inlet.

Although a single phase extractor is described herein, it should be understood that other types of extractor and other types of inlet may be used.

Figure 7:
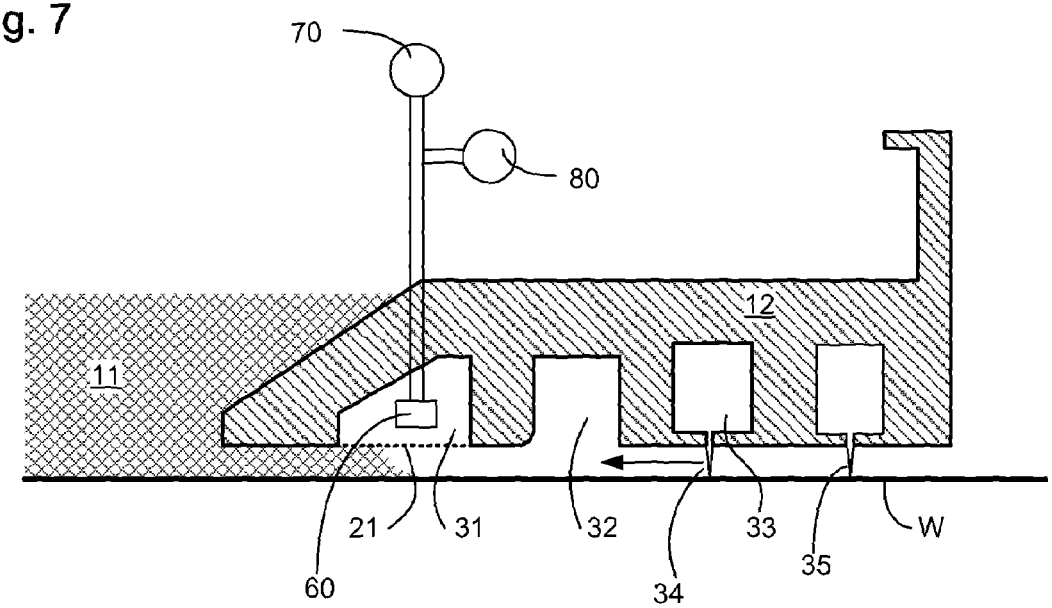
FIG. 7 depicts schematically, in cross-section, a liquid confinement system according to an embodiment of the present invention.

In an embodiment of the liquid confinement structure 12 illustrated in FIG. 7, a second gas knife 35 is provided radially outwardly of the gas knife 33 of FIG. 6c. The principles of the embodiment illustrated in FIG. 7 can also be applied to the liquid confinement structure 12 of FIG. 6c. As shown in FIG. 7, a filter 60 is provided in a conduit downstream of the porous member 21. A pump, such as a volume pump 70, applies an underpressure to the filter 60. The underpressure results in liquid passing through the filter 60. The pump is controlled so as to have a constant flow of liquid through the filter 60.

A pressure sensor 80, such as a gauge, is provided. The pressure sensor 80 measures the pressure of fluid extracted through the filter. More particularly, the pressure sensor 80 measures pressure of fluid in a conduit between the filter 60 and the pump 70. In this way, it is possible to gauge contamination and therefore a decrease in contact angle. As the filter 60 gets clogged with contaminant particles, the pressure measured by the pressure sensor 80 increases as the pump 70 maintains constant flow. Thus the pressure increase is a measurement of the level of contamination, for example a pressure over a certain threshold may indicate a certain threshold number of contaminant particles. The effectiveness of this system of measuring contamination may be improved if the aspect ratio is such that the contact area versus the height is large. This increases the sensitivity because then any pressure increase due to the blockage is higher than the inherent resistance of the filter (which is a function of height).

Thus the embodiment illustrated in FIG. 7 is similar to the embodiment illustrated in FIG. 6c in that contaminant particles passing into the extractor may be detected. When a certain amount of contamination is detected (i.e. a certain pressure drop over time is measured) an indication that a threshold level has been reached may be provided, as discussed above.

Of course the filter 60 may become fully clogged and so may need periodic replacement. However the filter may not need to be replaced each time the threshold level has been reached. This is because a history of the pressure measured by the pressure sensor 80 can be maintained so that changes in pressure drop over time can be used to determine what type of remedial action may be needed.

The filter 60 may be placed at different locations. These locations can be the same as those suggested for the particle counter. A further location for the filter could be in the bottom surface of the liquid confinement system 12 radially inwardly of the single phase extractor. The filter could be annular (i.e. in a continuous loop) or at one or more discrete locations.

The design of the single phase extractor is such that an under pressure is applied to chamber 31. This is done by a pump which is in fluid communication with the chamber 31, via a buffer tank. The pressure in the buffer tank (at the liquid/gas interface) can also be used to gauge the performance of the single phase extractor as described above. That is, the porous member 21 itself may be used as the filter.

In an embodiment, rather than measuring the number of contaminant particles, the performance of the liquid supply or liquid removal system may be measured. As will be appreciated, contamination of a liquid inlet or outlet results in different flow of liquid through the inlet or outlet. Lithographic apparatus are sensitive to temperature fluctuation. Therefore most apparatus have a controller monitoring temperature. The controller often applies heating or cooling through a heater or cooler to maintain a stable temperature. In an embodiment, variation in heat load may be measured.

If any heater or cooler is deactivated, measurement of the temperature or measurement of the rate of rise or rate of fall of temperature can provide information as to the performance of the liquid supply/removal system. For example, measurement of the temperature can be made when the liquid inlet or outlet is known to be clean. Then the same measurement can be made later after use under the same or similar conditions. Comparing temperature profiles of the two measurements can yield information about the performance of the machine. For example, a change in a measured parameter beyond a certain level can indicate a loss of performance. A specific example will be given below with reference to the liquid containment system of FIG. 6c.

In the liquid containment system of FIG. 6c any liquid which is not contained by the single phase extractor is contained by gas knife 34. Contact of liquid with gas flow associated with the gas knife 34/extraction ring 32 leads to evaporation and therefore cooling. Thus, when the performance of the single phase extractor is compromised due to contamination, the temperature of the liquid containment system may decrease. The rate of decrease (or absolute level of decrease) in temperature may therefore be a good guide as to the level of performance of the single phase extractor. Thus, comparing the absolute value after a given time of activation or the rate of decrease in temperature to the same absolute value or rate measured under similar circumstances for a clean liquid confinement system may give information on performance. If the difference in absolute temperature or the difference in rate is above a certain value, a signal indicating that the contamination has reached a level at which remedial action may need to be taken may be generated, as discussed above.

It can be seen that it is also possible to measure the temperature of one or more other components than the liquid confinement system. For example, the substrate and/or substrate table may see increased cooling after a reduction performance of the single phase extractor. Thus the same methodology as described above can be used by measuring the temperature variation of the substrate or substrate table when any heater or cooler in the substrate or substrate table has been deactivated.

As should be appreciated, flow of liquid in a conduit in an immersion lithography system may result in cooling of a component around that conduit. Thus the principles described above in relation to the liquid confinement system of FIG. 6c can also be applied to one or more other components.

In an embodiment, instead of deactivating any heater or cooler, the lithographic apparatus can be used as normal. By monitoring power applied to any heater or cooler in order to maintain a constant temperature it is possible to obtain information about contamination of the single phase extractor 31 in a similar way to that discussed above. That is, a known power profile to a heater or cooler for an uncontaminated liquid confinement system is compared to the same parameters under the same or similar conditions after a period of use. When the power supplied to the heater or cooler is different by more than a certain amount, a signal indicative that remedial action may need to be taken can be generated. This embodiment may be used in-line.

Figure 8:
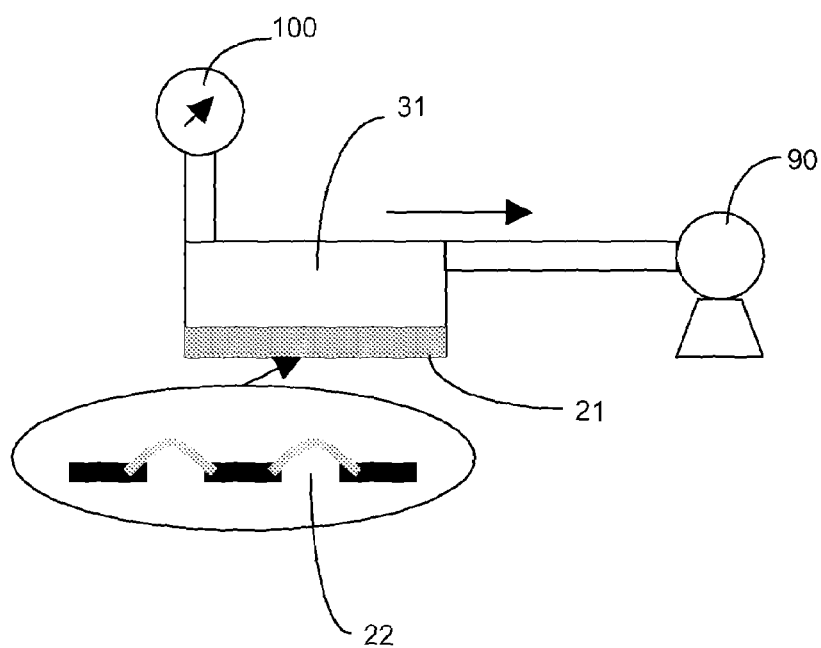
FIG. 8 depicts schematically, in cross-section, a liquid confinement system according to an embodiment of the present invention.

FIG. 8 illustrates an embodiment of a single phase extractor with a porous member 21. As illustrated, the whole of the porous member 21 may be covered in liquid. An underpressure may be applied to the downstream side of the porous member 21. The underpressure may be applied by a pump 90, such as a volume pump. Gas from the downstream side of the porous member 21 (i.e. from chamber 31) may be extracted and may be extracted at a constant flow rate. A pressure sensor 100, such as a gauge, may measure the pressure of the gas on a downstream side of the porous member 21 (i.e. in the chamber 31). The surface tension of the liquid across the holes in the porous member 21 may prevent liquid from entering the downstream side of the porous member 21 at a low underpressure. When the liquid can no longer maintain the meniscus over the holes through the porous member 21, liquid may enter the chamber 31. A sudden pressure change may be detected by the pressure sensor 100. This is the so-called "bubble" point. The bubble point is a function of the contact angle of the porous member 21 to the liquid. As described above, the more contamination on the porous member 21 the less hydro- or liquid-philic the porous member 21 becomes. Thus the bubble point may be an indirect measurement of contamination of the porous member 21.

A method of the embodiment illustrated in FIG. 8 may be performed offline. When the pressure of the bubble point is below a certain value, then a signal can be generated indicating that remedial action may need to be taken.

In an embodiment, a porous member 21 may be attached to the underside of a liquid confinement system. The porous member 21 may not perform any role in the functioning of the liquid confinement system. However, the porous member may be used as described above as a measurement of contamination of the surface of the liquid confinement system. Of course the porous member 21 and above method can be used to measure contamination of any component in an immersion lithographic apparatus as described above without forming an active component with a use other than to measure contamination.

Figure 9:
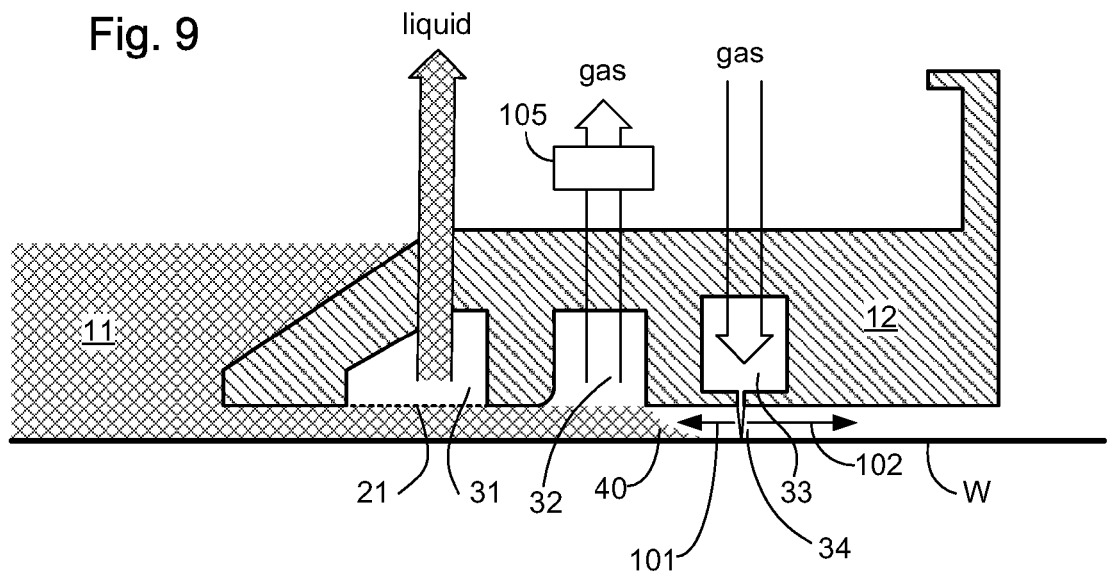
FIG. 9 depicts schematically, in cross-section, a liquid confinement system according to an embodiment of the present invention.

FIG. 9 illustrates an embodiment of a liquid confinement system that is similar to that illustrated in FIGS. 6 and 7. However, as with the other embodiments, an embodiment of the invention can similarly be applied to other types of liquid confinement systems.

In FIG. 9, a meniscus 40 of the liquid 11 is shown as having extended beyond the porous member 21. That is, for one reason or another (e.g. due to contamination and therefore a decrease in contact angle) the single phase extractor is not working correctly. In this circumstance, the gas from the gas knife 34 may be effective to contain the liquid. In normal operation, gas from gas knife 34 travels in both directions 101 and 102 (i.e. radially inwardly and radially outwardly). Gas, which travels radially inwardly (as indicated by arrow 101), may then extracted through the gas extraction ring 32. However, in the circumstance illustrated in FIG. 9, the gas from the gas knife 34 may be impeded from moving freely radially inwardly by the presence of liquid. This may result in a change in flow rate of gas out through the gas extraction ring 32. This change in flow may be detected, for example, by using a sensor 105. The change in flow may be an indicator that liquid has leaked past the single phase extractor and that, therefore, the performance of the single phase extractor may have been compromised.

The gas extraction ring 32 may either be maintained at a constant under pressure or can have a constant flow of gas extracted through it. In the first instance, a change in flow may indicate leaking of liquid and in the second instance a change in under-pressure may indicate leaking of liquid. In the first instance, sensor 105 may be a flow rate sensor and in the second instance, sensor 105 may be a pressure sensor.

In an embodiment, sensors are provided in the gas extraction ring 32 or down stream (as illustrated by sensor 105) of it around the periphery of the gas extraction ring 32. The periphery may be circumferential. The sensors measure either flow rate or under-pressure as described above. The sensors can be used to identify whereabouts around the periphery (e.g. circumference) of the liquid confinement system 12 leaking has occurred. This information can be used to determine which part of the single phase extractor around the periphery (e.g. circumference) of the single phase extractor has leaked. It may then only be necessary to clean or replace part of the single phase extractor or to reduce speed of motions in a particular direction. The values measured by the sensors can be stored for analysis later.

When the values detected by the sensors are above or below a certain threshold, as the case may be, a signal can be generated which indicates a loss in performance below a certain threshold. That signal brings to attention that the performance of the fluid handling system has dropped below the certain threshold. Remedial action can then be taken, if deemed necessary as described above.

As described above, leaking of the liquid confinement system may result in more liquid being present between the liquid confinement system 12 and the substrate W. A change in the amount of liquid between those two components may result in a different force between those two components. Additionally, a change in the flow pattern of gas exiting the gas knife 34 may also result in a change in force between the two components. Thus, a further performance parameter which may be measured is the force applied by an actuator used to support the liquid confinement system 12. A change in force beyond a normal level of force can be indicative of contamination of the porous member 21 which results in leaking of liquid. As described above, it may be desirable to compare the measurements made to a profile or force applied over time for known circumstances and an uncontaminated liquid confinement system.

When the force is above or below a certain threshold, a signal can be generated which indicates a loss in performance below a certain threshold. The signal can bring to attention that the performance of the fluid handling system has dropped below the certain threshold. For example, the signal that indicates a loss in performance below a certain threshold may be brought to the attention of a user of the system and/or the attention of a controller.

Figure 10:
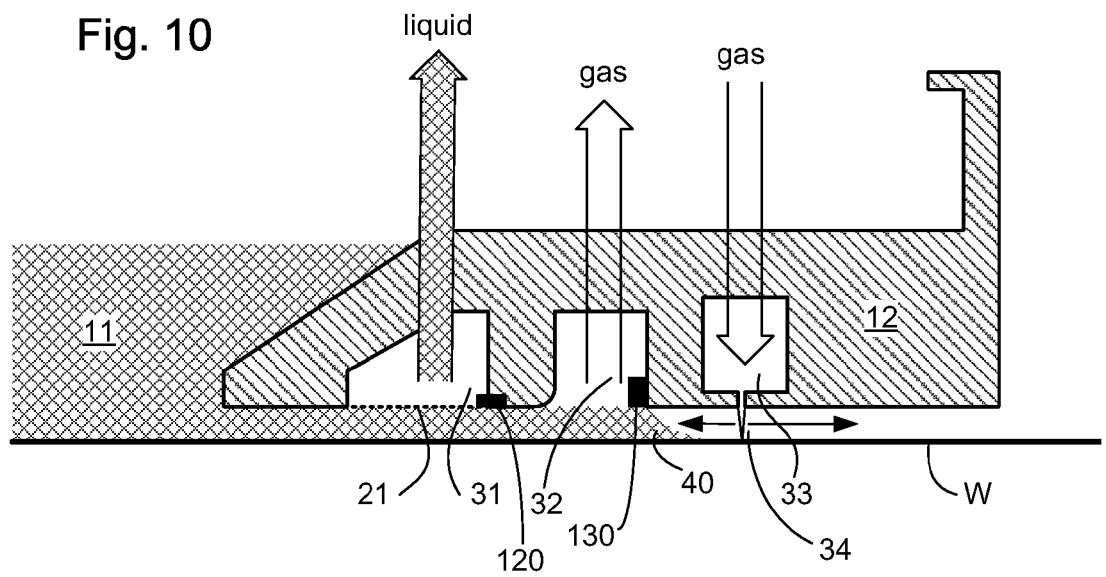
FIG. 10 depicts schematically, in cross-section, a liquid confinement system according to an embodiment of the present invention.

An embodiment of the liquid confinement system 12 is illustrated in FIG. 10, and may be the same liquid confinement system 12 that is illustrated in FIG. 9, except as described below.

As illustrated, one or more of sensors 120, 130 may be used to detect any liquid leaking past the single phase extractor. The sensor(s) can be positioned anywhere and can be any type of suitable sensor. For example, at least one of the sensor 120, 130 may be a capacitive sensor which measures the capacitance at a position between the liquid confinement system 12 and the substrate W or substrate table WT. This measurement can indicate the presence or otherwise of liquid at the position of the sensor between the liquid confinement system 12 and the substrate W or substrate table WT. The sensor(s) may be on an underside of the liquid confinement system.

In FIG. 10, two positions of the sensors are illustrated. One of these sensors 130 is at the radially outward most edge of the gas extraction ring 32. The sensor 130 may be in the form of neighboring plates or may measure the capacitance between such a plate and the substrate or substrate table. Alternatively or additionally, the sensor may be a magnetic sensor. These types of sensors are described in European Patent Application Publication No. 1,477,856 A1.

A further position is represented by sensor 120 which is illustrated at the radially outward most edge of the porous member 21. This works in the same way as the sensor 130. A further possibility is to use the porous member 21 itself as an electrode of the sensor. The capacitance and/or magnetic properties may vary as the meniscus 40 of liquid travels across the porous member 21.

With all of the above described embodiments, individual sensors may be positioned at discrete locations around the periphery of the liquid confinement system 12. In this way, the precise location of any leak may be detected. When liquid is detected at a position beyond where it is expected by a certain margin, a signal may be generated to indicate that remedial action may need to be taken, as described above.

It is also possible to measure liquid loss off line. This can be done by detecting defects in a substrate after it has been imaged. Some defects are the result of liquid loss. Also, the loss of efficiency of an optical sensor can be used to detect leaking of liquid. For example, the optical sensor which detects the height of the substrate table (or the level sensor which measures the transmission image sensor plate height) decreases in performance when it becomes wet. In any case, detecting liquid loss off-line may be used to generate a signal if the detecting indicates that there has been a loss in performance below a certain threshold. The signal can be used as described above in deciding what action to take.

In an embodiment, an optical sensor (e.g., level sensor) based liquid (e.g., water) detection tool and test in an immersion system is disclosed. Such a tool and test allows for checking of liquid location, possible gas knife obstruction locations, etc. It may be used efficiently as an investigation and/or monitoring tool (duration <30 min).

Liquid loss in immersion lithography systems due to liquid handling system (e.g., liquid confinement structure 12) contamination, such as an obstruction or contamination of a gas knife, a single phase extractor or other opening (e.g. an extractor opening), can lead to defects on production substrates and/or metrology errors. A potential gas knife obstruction may be detected by hovering a sensor over a bare substrate using certain motions of the substrate and inspecting the substrate surface afterwards for particles at various locations (e.g., four quadrant tests (4QTs) looking for particles in four quadrants on the surface of the substrate). Residual contaminated liquid trails on a substrate will leave a trail of particles when evaporating.

Analysis of such 4QTs results may be subject to interpretation errors because it is an indirect measurement method. For example, particles left on the substrate are the effect (evaporation of contaminated liquid) of the effect (liquid loss) of the root cause (a gas knife obstruction). Further, to be efficient and reliable, residual liquid left by a liquid handling system should contain a certain amount of particles so that the residual liquid can be related to the general defectively level of the lithography system. This is in contradiction with the fact that lithography equipment industry and customers are always driving to getting lower defectively. Also, such a test can require a significant amount of machine time, substrates as well as surface inspection time on a second tool.

Accordingly, in an embodiment, a level sensor (LS), which is an optical metrology tool used in lithography systems to determine substrate and/or sensor position in the Z axis, is used to detect liquid. Liquid left on the surface inspected with the level sensor will introduce a disturbance in the measurement using the level sensor due to radiation scattering. This principle is used to detect residual liquid left by a liquid handling system in an immersion lithography system. For example, the disturbance may be determined by measuring the scattered radiation or by detecting loss of radiation due to the scattering. In an embodiment, a standard level sensor in an immersion lithography system for positioning the substrate in, for example, focus is adapted to provide the liquid detection system described herein. Such adaptation may be an update of software used to control and/or receive information from the level sensor.

Figure 11:
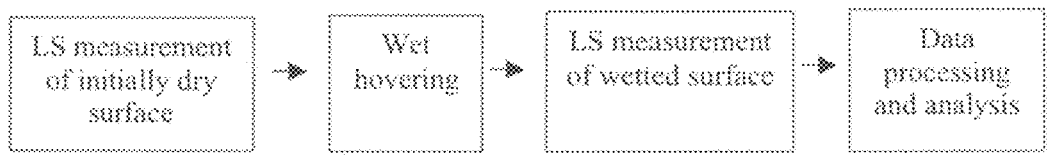
FIG. 11 depicts a flow chart of an optical sensor test sequence according to an embodiment of the present invention.

Referring to FIG. 11, a test sequence includes measuring the initially dry surface of interest with the level sensor (e.g., a surface of the substrate), hovering wet on this same surface (e.g., moving the surface with respect to the liquid handling system while providing liquid to the surface with the liquid handling system) and re-measuring the surface with the level sensor afterwards.

Residual liquid left on the surface can then be detected by representing the measured height difference as a function of space. Alternatively or additionally, the detector of the level sensor can plot a radiation intensity ratio between the intensity of reflected radiation in the initial and the later (post) measurements as a function of space. Combined with the use of certain specific hovering routes (e.g. pattern of relative movement between the substrate and the liquid handling system), this data allows pin-pointing of the location of, e.g., a gas knife obstruction.

Figure 12:
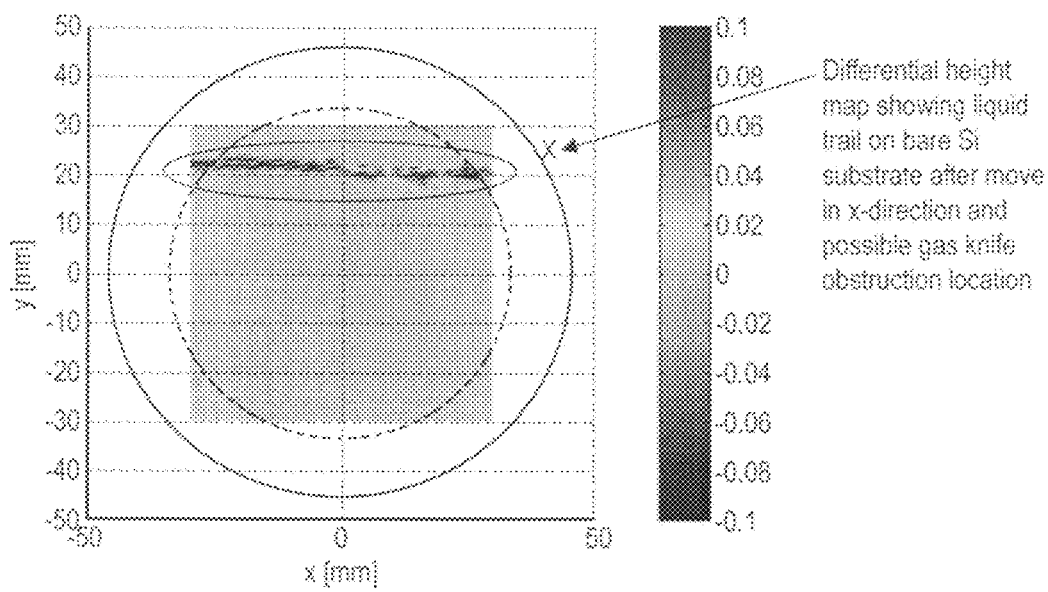
FIGS. 12 and 13 depict sample results from an optical sensor test sequence according to an embodiment of the present invention.
Figure 13:
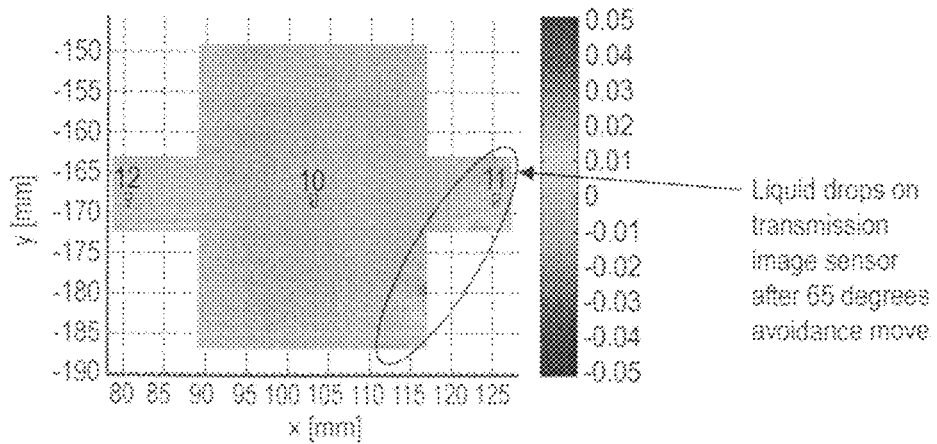

FIGS. 12 and 13 depict sample results from an optical (level) sensor test sequence according to an embodiment of the present invention showing the location of residual liquid left on the surface and possible causes of the residual liquid (such as a gas knife obstruction). FIG. 12 shows the results achieved in comparing the measured height difference as a function of space using a level sensor. As can be seen, across the top of the imaged area, there is a line where the height difference is quite large. This is indicative of a trail of liquid on the substrate. This trail of liquid was left behind after a move relative to the liquid handling system in the x-direction. This indicates a possible obstruction in the gas knife in a corresponding position. This is represented in FIG. 12 by a cross on a circle in which the circle represents the gas knife of the liquid handling system, in plan.

FIG. 13 is a similar representation of the measured height difference as a function of space. The FIG. 13 example is the measurement of the top of a transmission image sensor (TIS). The image is taken after the liquid handling system has been moved relative to the transmission image sensor in a 65° direction. As can be seen, a trail of liquid has been left behind at an angle roughly equal to the direction of relative movement. From this data, it is possible to gauge where an obstruction in the gas knife of the liquid handling system might be.

Possibly coupled to liquid handling system (e.g., liquid confinement structure 12) temperature monitoring as disclosed herein, the 4QTs may be complemented or replaced with the level sensor detection tool and/or test described above with the following possible improvements:

Machine time reduction: from ~2 h to 0.5 h.

Cost of goods: from 26 substrates to 2 substrates.

No additional tool required for surface inspection of the substrates.

In an embodiment, a built-in camera on the exposure side of the immersion lithographic system may be used in addition to or as an alternative to the level sensor. Such a camera may be incorporated in the liquid handling system (e.g., liquid confinement structure 12).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or a data storage medium (e.g. semiconductor memory, magnetic or optical disk) having such a computer program stored therein. At least one controller may be provided to control the apparatus. One or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs. Each controller may operate at least a component of the apparatus according to the one or more of the computer programs embodying the invention.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, a method of operating a fluid handling system of an immersion lithographic apparatus comprises: measuring a performance parameter of the fluid handling system indicative of a level of containment of fluid between the fluid handling system and a substrate and/or substrate table; and generating a signal if the measuring indicates a loss in performance below a certain threshold which signal brings to attention that the containment performance of the fluid handling system has dropped below the certain threshold. In an embodiment, the measuring is indirect measuring of the fluid containment performance of the fluid handling system. In an embodiment, the measuring comprises (i) detecting a variation in heat loss of the fluid handling system or (ii) detecting a pressure variation on an outlet side of a single phase extractor of the fluid handling system or (iii) counting contaminant particles in a fluid flow associated with the fluid handling system or (iv) detecting a pressure variation and/or flow rate variation in fluid passing through an outlet and/or an inlet of the fluid handling system or (v) detecting liquid leaking past a confinement component of the fluid handling system or (vi) detecting a change in force applied to the fluid handling system in order to maintain its desired position or (vii) any combination selected from (i)-(vi). Desirably the measuring comprises detecting a variation in heat loss by monitoring power supplied to a heater used to maintain the temperature of a component substantially constant. Additionally or alternatively the measuring comprises detecting a variation in temperature of a component when any heater used to heat the component system is turned off. Additionally or alternatively the measuring comprises comparing the performance parameter to a previously measured value under similar conditions of use of a fluid handling system which is not in need of cleaning. Additionally or alternatively the measuring comprises detecting a pressure variation on an outlet side of the single phase extractor. In an embodiment, the method comprises extracting fluid at a constant rate from a first side of a porous member of the single phase extractor, an opposite side of the porous member being covered in liquid, and monitoring a pressure on the first side of the porous member. Desirably a pressure at which a sudden pressure change occurs is compared to a certain pressure value and if the pressure at which a sudden pressure variation occurs is smaller than the certain pressure value, a loss in performance is indicated. Additionally or alternatively the method comprises extracting fluid from a first side of a porous member of the single phase extractor, withdrawing fluid at a constant rate through a filter on the first side and measuring a pressure variation in the fluid being removed at a constant rate. In an embodiment, the method further comprises, in response to the signal, (i) cleaning at least part of the fluid handling system, or (ii) replacing at least part of the fluid handling system, or (iii) changing an operating parameter of the immersion lithographic apparatus, or (iv) any combination selected from (i)-(iii). In an embodiment, the bringing to attention is bringing to the attention of a user or to the attention of a controller of the immersion lithographic apparatus. In an embodiment, the substrate table comprises a shutter member and wherein the measuring is indicative of a level of containment of fluid between the fluid handling system and the shutter member.

In an embodiment, a method of detecting contamination of a fluid handling system of an immersion lithographic apparatus comprises (i) detecting a change in heat loss from a component during operation of the fluid handling system or (ii) detecting a pressure variation on an outlet side of a single phase extractor of the fluid handling system or (iii) counting contaminant particles in a fluid flow associated with the fluid handling system or (iv) detecting a pressure variation and/or flow rate variation in fluid passing through an outlet and/or an inlet of the fluid handling system or (v) detecting liquid leaking past a confinement component of the fluid handling system or (vi) detecting a change in force applied to the fluid handling system in order to maintain its desired position or (vii) any combination selected from (i)-(vi). Desirably the component is a part of or the fluid handling system or a substrate or a substrate table.

In an embodiment, a method of detecting contamination of a fluid handling system of a lithographic apparatus comprises contacting a porous member of the fluid handling system with fluid on a first side; removing fluid at a constant rate from a second side of the porous member which second side is opposite the first side; and detecting contamination by monitoring pressure of the fluid removed at the constant rate. Desirably liquid is provided on the first side of the porous member and the removing fluid comprises removing gas from the second side of the porous member, wherein a pressure at which a sudden pressure change occurs is compared to a certain pressure, if the pressure at which a sudden pressure change occurs is lower than the certain pressure, contamination at a level at which cleaning of the fluid handling system is required is detected. Desirably the fluid removed at a constant rate from the second side of the porous member is liquid which is removed through a filter and the pressure is pressure of the liquid removed through the filter.

In an embodiment, a method of detecting contamination of a fluid handling system of an immersion lithographic apparatus comprises: extracting fluid from a space between a projection system and a substrate and/or substrate table; counting the number of contaminant particles present in the extracted fluid; and determining when the number of contaminant particles exceeds a certain threshold.

In an embodiment, an immersion lithographic apparatus comprises a fluid handling system and a controller configured to measure a performance parameter of the fluid handling system and to bring to attention that the performance of the fluid handling system has dropped below a certain threshold if the measurement indicates a loss in performance below a certain threshold. Desirably the controller is configured to detect a variation in heat loss of a component and/or a pressure variation on an outlet side of a single phase extractor of the fluid handling system. Desirably the fluid handling system comprises a particle counter configured to count the number of particles in a fluid handled by the fluid handling system. Desirably the fluid handling system comprises, on a first side of a porous member which first side is internal to the fluid handling system, a pressure sensor configured to measure pressure of fluid on the first side of the porous member. In an embodiment, the apparatus further comprises a filter on the first side of the porous member and a pump configured to extract fluid through the filter at a constant rate, wherein the pressure sensor is configured to measure the pressure of the fluid extracted at a constant rate. Desirably the apparatus further comprises (i) a sensor configured to sense the presence of fluid between the fluid handling system and a substrate, or (ii) a pressure sensor configured to measure the pressure of fluid in a fluid inlet and/or a fluid outlet of the fluid handling system, or (iii) a flow sensor configured to measure flow through an inlet and/or outlet of the fluid handling system, or (iv) any combination selected from (i)-(iii).

In an embodiment, a method of operating a fluid handling system of an immersion lithographic apparatus comprises: detecting a pressure variation on an outlet side of a single phase extractor of the fluid handling system; and generating a signal if the detecting indicates a level of containment of fluid between the fluid handling system and a substrate and/or substrate table has dropped below a certain threshold. In an embodiment, the detecting is indirect measuring of the fluid containment performance of the fluid handling system. In an embodiment, the detecting comprises extracting fluid at a constant rate from a first side of a porous member of the single phase extractor, an opposite side of the porous member being covered in liquid, and monitoring a pressure on the first side of the porous member. Desirably a pressure at which a sudden pressure change occurs is compared to a certain pressure value and if the pressure at which a sudden pressure change occurs is smaller than a certain pressure value, the level of containment of fluid between the fluid handling system and the substrate has dropped below the certain threshold. In an embodiment, the detecting comprises extracting fluid from a first side of a porous member of the single phase extractor and withdrawing fluid at a constant rate through a filter on the first side and measuring a pressure variation in the fluid being removed at a constant rate. In an embodiment, the method further comprises, in response to the signal, cleaning at least part of the fluid handling system. In an embodiment, the method further comprises, in response to the signal, replacing at least part of the fluid handling system. In an embodiment, the method further comprises, in response to the signal, changing an operating parameter of the immersion lithographic apparatus. In an embodiment, the method further comprises, in response to the signal, bringing to the attention of a user or to the attention of a controller of the immersion lithographic apparatus that the containment performance of the fluid handling system has dropped below the certain threshold.

In an embodiment, a method of operating a fluid handling system of an immersion lithographic apparatus comprises: counting contaminant particles in a fluid flow associated with the fluid handling system; and generating a signal if a number of particles exceeds a certain threshold, the certain threshold being indicative of a reduction in a level of containment of fluid between the fluid handling system and a substrate and/or substrate table. Desirably the counting is indirect measuring of the fluid containment performance of the fluid handling system. In an embodiment, the method further comprises extracting fluid from a first side of a porous member of a single phase extractor of the fluid handling system, wherein the counting contaminant particles in the fluid flow comprises counting contaminant particles that have passed through the porous member to a second side. In an embodiment, the method further comprises, in response to the signal, cleaning at least part of the fluid handling system. In an embodiment, the method further comprises, in response to the signal, replacing at least part of the fluid handling system. In an embodiment, the method further comprises, in response to the signal, changing an operating parameter of the immersion lithographic apparatus. In an embodiment, the method further comprises, in response to the signal, bringing to the attention of a user or to the attention of a controller of the immersion lithographic apparatus that the containment performance of the fluid handling system has dropped below the certain threshold.

In an embodiment, a method of operating a fluid handling system of an immersion lithographic apparatus comprises: detecting a variation in heat loss of the fluid handling system; and generating a signal if the detecting indicates a level of containment of fluid between the fluid handling system and a substrate and/or substrate table has dropped below a certain threshold. Desirably the detecting is indirect measuring of the fluid containment performance of the fluid handling system. Desirably the detecting a variation in heat loss comprises monitoring power supplied to a heater configured to maintain the temperature of a component substantially constant. Desirably the detecting a variation in heat loss comprises monitoring the temperature of a component when any heater configured to heat the component system is turned off. In an embodiment, the method further comprises, in response to the signal, cleaning at least part of the fluid handling system. In an embodiment, the method further comprises, in response to the signal, replacing at least part of the fluid handling system. In an embodiment, the method further comprises, in response to the signal, changing an operating parameter of the immersion lithographic apparatus. In an embodiment, the method further comprises, in response to the signal, bringing to the attention of a user or to the attention of a controller of the immersion lithographic apparatus that the containment performance of the fluid handling system has dropped below the certain threshold.

In an embodiment, a method of operating a fluid handling system of an immersion lithographic apparatus comprises: detecting a pressure variation and/or a flow rate variation in fluid passing through an outlet and/or an inlet of the fluid handling system; and generating a signal if the detecting indicates a level of containment of fluid between the fluid handling system and a substrate and/or substrate table has dropped below a certain threshold. In an embodiment, the method further comprises, in response to the signal, cleaning at least part of the fluid handling system. In an embodiment, the method further comprises, in response to the signal, replacing at least part of the fluid handling system. In an embodiment, the method further comprises, in response to the signal, changing an operating parameter of the immersion lithographic apparatus. In an embodiment, the method further comprises, in response to the signal, bringing to the attention of a user or to the attention of a controller of the immersion lithographic apparatus that the containment performance of the fluid handling system has dropped below the certain threshold.

In an embodiment, a method of operating a fluid handling system of an immersion lithographic apparatus comprises: detecting liquid leaking past a confinement component of the fluid handling system; and generating a signal if the detecting indicates a level of containment of fluid between the fluid handling system and a substrate and/or substrate table has dropped below a certain threshold. In an embodiment, the method further comprises, in response to the signal, cleaning at least part of the fluid handling system. In an embodiment, the method further comprises, in response to the signal, replacing at least part of the fluid handling system. In an embodiment, the method further comprises, in response to the signal, changing an operating parameter of the immersion lithographic apparatus. In an embodiment, the method further comprises, in response to the signal, bringing to the attention of a user or to the attention of a controller of the immersion lithographic apparatus that the containment performance of the fluid handling system has dropped below the certain threshold.

In an embodiment, a method of operating a fluid handling system of an immersion lithographic apparatus comprises: detecting a change in force applied to the fluid handling system in order to maintain its desired position; and generating a signal if the detecting indicates a level of containment of fluid between the fluid handling system and a substrate and/or substrate table has dropped below a certain threshold. In an embodiment, the method further comprises, in response to the signal, cleaning at least part of the fluid handling system. In an embodiment, the method further comprises, in response to the signal, replacing at least part of the fluid handling system. In an embodiment, the method further comprises, in response to the signal, changing an operating parameter of the immersion lithographic apparatus. In an embodiment, the method further comprises, in response to the signal, bringing to the attention of a user or to the attention of a controller of the immersion lithographic apparatus that the containment performance of the fluid handling system has dropped below the certain threshold.

In an embodiment, a method of detecting residual liquid from a fluid handling system of a lithographic apparatus comprises: applying a liquid to a surface using the fluid handling system; moving the surface relative to the fluid handling system, residual liquid remaining on the surface after the moving; directing a beam of radiation at the surface, at least part of the beam scattering due to the residual liquid; and determining the presence of the residual liquid by measuring the scattered radiation or by detecting loss of radiation due to the scattering. Desirably the directing the beam is performed using an optical level sensor. Desirably the method comprises measuring the surface dry with a beam of radiation before directing the beam of radiation at the residual liquid. Desirably the determined presence of the residual liquid is indicative of contamination of the fluid handling system.

In an embodiment, an immersion lithographic apparatus comprises: a fluid handling system; an optical sensor configured to direct a beam of radiation at a surface, at least part of the beam scattering due to residual liquid from the fluid handling system on the surface; and a controller configured to determine presence of the residual liquid by measuring the scattered radiation or by detecting loss of radiation due to the scattering.

In an embodiment, a method of detecting residual liquid from a fluid handling system of a lithographic apparatus comprises: determining a first height profile of a surface; applying a liquid to the surface using the fluid handling system; moving the surface relative to the fluid handling system, residual liquid remaining on the surface after the moving; determining a second height profile of the surface and the residual liquid remaining on the surface; and determining the presence of the residual liquid by comparing the first and second height profiles.

The descriptions above are intended to be illustrative, not limiting. Thus, it will be apparent to one skilled in the art that modifications may be made to the invention as described without departing from the scope of the claims set out below.

What is claimed is:

1. A method of operating a fluid handling system of an immersion lithographic apparatus, the method comprising:
measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring the performance parameter comprising detecting a pressure variation on an outlet side of a single phase extractor of the fluid handling system; and
generating a signal if the measuring indicates a loss in performance below a certain threshold which signal brings to attention that the containment performance of the fluid handling system has dropped below the certain threshold, the generating the signal comprising generating a signal if the detecting indicates a level of containment of fluid between the fluid handling system and a substrate and/or substrate table has dropped below a certain threshold.

2. The method of claim 1, wherein the detecting is indirect measuring of the fluid containment performance of the fluid handling system.

3. The method of claim 1, wherein the detecting comprises extracting fluid at a constant rate from a first side of a porous member of the single phase extractor, an opposite side of the porous member being covered in liquid, and monitoring a pressure on the first side of the porous member.

4. The method of claim 1, wherein a pressure at which a sudden pressure change occurs is compared to a certain pressure value and if the pressure at which a sudden pressure change occurs is smaller than a certain pressure value, the level of containment of fluid between the fluid handling system and the substrate has dropped below the certain threshold.

5. The method of claim 4, wherein the detecting comprises extracting fluid from a first side of a porous member of the single phase extractor and withdrawing fluid at a constant rate through a filter on the first side and measuring a pressure variation in the fluid being removed at a constant rate.

6. The method of claim 1, further comprising, in response to the signal, cleaning at least part of the fluid handling system.

7. The method of claim 1, further comprising, in response to the signal, replacing at least part of the fluid handling system.

8. The method of claim 1, further comprising, in response to the signal, changing an operating parameter of the immersion lithographic apparatus.

9. The method of claim 1, further comprising, in response to the signal, bringing to the attention of a user or to the attention of a controller of the immersion lithographic apparatus that the containment performance of the fluid handling system has dropped below the certain threshold.

10. A method of operating a fluid handling system of an immersion lithographic apparatus, the method comprising:
    measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring the performance parameter comprising detecting a pressure variation in fluid passing through an outlet and/or an inlet of the fluid handling system; and
    generating a signal if the measuring indicates a loss in performance below a certain threshold which signal brings to attention that the containment performance of the fluid handling system has dropped below the certain threshold, the generating the signal comprising generating a signal if the detecting indicates a level of containment of fluid between the fluid handling system and a substrate and/or substrate table has dropped below a certain threshold.

11. The method of claim 10, further comprising, in response to the signal, cleaning at least part of the fluid handling system.

12. The method of claim 10, further comprising, in response to the signal, replacing at least part of the fluid handling system.

13. The method of claim 10, further comprising, in response to the signal, changing an operating parameter of the immersion lithographic apparatus.

14. The method of claim 10, further comprising, in response to the signal, bringing to the attention of a user or to the attention of a controller of the immersion lithographic apparatus that the containment performance of the fluid handling system has dropped below the certain threshold.

15. A method of operating a fluid handling system of an immersion lithographic apparatus, the method comprising:
    measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring the performance parameter comprising (i) detecting a variation in heat loss of the fluid handling system or (ii) detecting a pressure variation on an outlet side of an extractor of the fluid handling system or (iii) counting contaminant particles in a fluid flow associated with the fluid handling system or (iv) detecting a pressure variation in fluid passing through an outlet and/or an inlet of the fluid handling system or (v) detecting liquid leaking past a confinement component of the fluid handling system using a detector above the substrate and/or substrate table or (vi) detecting a change in force applied to the fluid handling system in order to maintain its desired position or (vii) monitoring pressure of fluid removed at a constant rate through a porous member of the fluid handling system, or (viii) any combination selected from (i)-(vii); and
    generating a signal if the measuring indicates a loss in performance below a certain threshold which signal brings to attention that the containment performance of the fluid handling system has dropped below the certain threshold.

16. A method of operating a fluid handling system of an immersion lithographic apparatus, the method comprising
    measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring comprising (i) detecting a change in heat loss from a component during operation of the fluid handling system or (ii) detecting liquid leaking past a confinement component of the fluid handling system using a detector above the substrate and/or substrate table or (iii) detecting a change in force applied to the fluid handling system in order to maintain its desired position or (vii) any combination selected from (i)-(iii); and
    generating a signal if the measuring indicates a loss in performance below a certain threshold which signal brings to attention that the containment performance of the fluid handling system has dropped below the certain threshold.

17. A method of operating a fluid handling system of a lithographic apparatus, the method comprising:
    contacting a porous member of the fluid handling system with fluid on a first side;
    removing fluid at a constant rate from a second side of the porous member which second side is opposite the first side;
    measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring comprising detecting contamination by monitoring pressure of the fluid removed at the constant rate; and
    generating a signal if the measuring indicates a loss in performance below a certain threshold which signal brings to attention that the containment performance of the fluid handling system has dropped below the certain threshold.

18. A method of operating a fluid handling system of an immersion lithographic apparatus, the method comprising:
    extracting fluid from a space between a projection system and a substrate and/or substrate table;
    measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring comprising counting the number of contaminant particles present in the extracted fluid and determining when the number of contaminant particles exceeds a certain threshold; and
    generating a signal if the measuring indicates a loss in performance below a certain threshold which signal brings to attention that the containment performance of the fluid handling system has dropped below the certain threshold.

19. An immersion lithographic apparatus comprising a fluid handling system and a controller configured to:
measure a performance parameter of the fluid handling system indicative of an effectiveness of containment of fluid by the fluid handling system to restrict undesired fluid escaping or leaking, the measurement of the performance parameter comprising (i) detection of a variation in heat loss of the fluid handling system or (ii) detection of a pressure variation on an outlet side of an extractor of the fluid handling system or (iii) a count of contaminant particles in a fluid flow associated with the fluid handling system or (iv) detection of a pressure variation in fluid passing through an outlet and/or an inlet of the fluid handling system or (v) detection of liquid leaking past a confinement component of the fluid handling system using a detector above the substrate and/or substrate table or (vi) detection of a change in force applied to the fluid handling system in order to maintain its desired position or (vii) monitoring pressure of fluid removed at a constant rate through a porous member of the fluid handling system, or (viii) any combination selected from (i)-(vii); and
bring to attention that the performance of the fluid handling system has dropped below a certain threshold if the measurement indicates a loss in containment performance below a certain threshold.

20. A method of operating a fluid handling system of an immersion lithographic apparatus, the method comprising:
measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring the performance parameter comprising counting contaminant particles in a fluid flow associated with the fluid handling system; and
generating a signal if the measuring indicates a loss in performance below a certain threshold which signal brings to attention that the containment performance of the fluid handling system has dropped below the certain threshold, the generating the signal comprising generating a signal if a number of particles exceeds a certain threshold, the certain threshold being indicative of a reduction in a level of containment of fluid between the fluid handling system and a substrate and/or substrate table.

21. A method of operating a fluid handling system of an immersion lithographic apparatus, the method comprising:
measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring the performance parameter comprising detecting a variation in heat loss of the fluid handling system; and
generating a signal if the measuring indicates a loss in performance below a certain threshold which signal brings to attention that the containment performance of the fluid handling system has dropped below the certain threshold, the generating the signal comprising generating a signal if the detecting indicates a level of containment of fluid between the fluid handling system and a substrate and/or substrate table has dropped below a certain threshold.

22. A method of operating a fluid handling system of an immersion lithographic apparatus, the method comprising:
measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring the performance parameter comprising detecting liquid leaking past a confinement component of the fluid handling system using a detector above the substrate and/or substrate table; and
generating a signal if the measuring indicates a loss in performance below a certain threshold which signal brings to attention that the containment performance of the fluid handling system has dropped below the certain threshold, the generating the signal comprising generating a signal if the detecting indicates a level of containment of fluid between the fluid handling system and a substrate and/or substrate table has dropped below a certain threshold.

23. A method of operating a fluid handling system of an immersion lithographic apparatus, the method comprising:
measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring the performance parameter comprising detecting a change in force applied to the fluid handling system in order to maintain its desired position; and
generating a signal if the measuring indicates a loss in performance below a certain threshold which signal brings to attention that the containment performance of the fluid handling system has dropped below the certain threshold, the generating the signal comprising generating a signal if the detecting indicates a level of containment of fluid between the fluid handling system and a substrate and/or substrate table has dropped below a certain threshold.

24. A method of operating a fluid handling system of a lithographic apparatus, the method comprising:
applying a liquid to a surface using the fluid handling system;
moving the surface relative to the fluid handling system, residual liquid remaining on the surface after the moving;
directing a beam of radiation at the surface using a detector above the substrate and/or substrate table, at least part of the beam scattering due to the residual liquid; and
measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring comprising detecting liquid leaking past a confinement component of the fluid handling system by determining the presence of the residual liquid by measuring the scattered radiation or by detecting loss of radiation due to the scattering; and
generating a signal if the measuring indicates a loss in performance below a certain threshold which signal brings to attention that the containment performance of the fluid handling system has dropped below the certain threshold.

25. An immersion lithographic apparatus comprising:
a fluid handling system;
an optical sensor configured to direct a beam of radiation from above the substrate and/or substrate table at a surface, at least part of the beam scattering due to residual liquid from the fluid handling system on the surface; and
a controller configured to:
measure a performance parameter of the fluid handling system indicative of an effectiveness of containment of fluid by the fluid handling system to restrict undesired fluid escaping or leaking, the measurement of the performance parameter comprising detection of liquid leaking past a confinement component of the fluid handling system by determining presence of the residual liquid by measuring the scattered radiation or by detecting loss of radiation due to the scattering; and
bring to attention that the performance of the fluid handling system has dropped below a certain threshold if the measurement indicates a loss in containment performance below a certain threshold.

26. A method of operating a fluid handling system of a lithographic apparatus, the method comprising:
determining a first height profile of a surface using a detector above the substrate and/or substrate table;
applying a liquid to the surface using the fluid handling system;
moving the surface relative to the fluid handling system, residual liquid remaining on the surface after the moving;
determining a second height profile of the surface and the residual liquid remaining on the surface; and
measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring comprising detecting liquid leaking past a confinement component of the fluid handling system by determining the presence of the residual liquid by comparing the first and second height profiles; and
generating a signal if the measuring indicates a loss in performance below a certain threshold which signal brings to attention that the containment performance of the fluid handling system has dropped below the certain threshold.

27. A method of operating a fluid handling system of a lithographic apparatus, the method comprising:
extracting fluid using the fluid handling system;
measuring a performance parameter of the fluid handling system indicative of an effectiveness of containment of fluid between the fluid handling system and a substrate and/or substrate table to restrict undesired fluid escaping or leaking between the fluid handling system and the substrate and/or substrate table, the measuring comprising counting a number of contaminant particles present in the extracted fluid; and
generating a signal if the measuring indicates a loss in performance below a certain threshold which signal brings to attention that the containment performance of the fluid handling system has dropped below the certain threshold, the generating the signal comprising generating a signal if the counted number of contaminant particles indicates a level of contamination of a part of the fluid handling system.

28. The immersion lithographic apparatus of claim 19, wherein the measurement of the performance parameter comprises the monitoring of pressure of fluid removed at a constant rate through a porous member of the fluid handling system.

29. The immersion lithographic apparatus of claim 19, wherein the measurement of the performance parameter comprises the detection of a pressure variation on an outlet side of an extractor of the fluid handling system.

* * * * *